(12) United States Patent
Heikman et al.

(10) Patent No.: US 8,592,868 B2
(45) Date of Patent: *Nov. 26, 2013

(54) NORMALLY-OFF SEMICONDUCTOR DEVICES

(75) Inventors: Sten Heikman, Goleta, CA (US); Yifeng Wu, Goleta, CA (US)

(73) Assignee: Cree, Inc., Durham, NC (US)

(*) Notice: Subject to any disclaimer, the term of this patent is extended or adjusted under 35 U.S.C. 154(b) by 0 days.

This patent is subject to a terminal disclaimer.

(21) Appl. No.: 13/483,737

(22) Filed: May 30, 2012

(65) Prior Publication Data

US 2012/0235160 A1 Sep. 20, 2012

Related U.S. Application Data

(60) Continuation of application No. 13/175,069, filed on Jul. 1, 2011, now Pat. No. 8,198,178, which is a division of application No. 12/183,672, filed on Jul. 31, 2008, now Pat. No. 7,985,986.

(51) Int. Cl.
*H01L 29/66* (2006.01)

(52) U.S. Cl.
USPC .................................. 257/194; 257/E29.246

(58) Field of Classification Search
USPC ........................................ 257/194, E29.246
See application file for complete search history.

(56) References Cited

U.S. PATENT DOCUMENTS

| | | | |
|---|---|---|---|
| 6,849,882 B2 | 2/2005 | Chavarkar et al. | |
| 7,045,404 B2 | 5/2006 | Sheppard et al. | |
| 7,112,860 B2 | 9/2006 | Saxler | |
| 7,985,986 B2* | 7/2011 | Heikman et al. | 257/194 |
| 2001/0040246 A1 | 11/2001 | Ishii | 257/192 |
| 2003/0218183 A1 | 11/2003 | Micovic et al. | 257/192 |
| 2005/0051796 A1 | 3/2005 | Parikh et al. | |
| 2005/0253168 A1 | 11/2005 | Wu et al. | |
| 2006/0019435 A1 | 1/2006 | Sheppard et al. | |
| 2006/0043416 A1 | 3/2006 | P. Li et al. | 257/192 |
| 2007/0114569 A1* | 5/2007 | Wu et al. | 257/194 |
| 2007/0158692 A1* | 7/2007 | Nakayama et al. | 257/213 |

(Continued)

FOREIGN PATENT DOCUMENTS

JP 2009004743 A 1/2009
WO WO2006001369 A1 1/2006

OTHER PUBLICATIONS

Cai et al., "High-Performance Enhancement-Mode AlGaN/GaN HEMTs Using Fluoride-Based Plasma Treatment," IEEE Electron Device Letters, vol. 26, No. 7, pp. 435-437, Jul. 2005.

(Continued)

*Primary Examiner* — Lex Malsawma
(74) *Attorney, Agent, or Firm* — Myers Bigel Sibley & Sajovec

(57) ABSTRACT

Normally-off semiconductor devices are provided. A Group III-nitride buffer layer is provided. A Group III-nitride barrier layer is provided on the Group III-nitride buffer layer. A non-conducting spacer layer is provided on the Group III-nitride barrier layer. The Group III-nitride barrier layer and the spacer layer are etched to form a trench. The trench extends through the barrier layer and exposes a portion of the buffer layer. A dielectric layer is formed on the spacer layer and in the trench and a gate electrode is formed on the dielectric layer. Related methods of forming semiconductor devices are also provided herein.

25 Claims, 13 Drawing Sheets

(56) References Cited

U.S. PATENT DOCUMENTS

| | | | |
|---|---|---|---|
| 2007/0224710 A1 | 9/2007 | Palacios et al. | |
| 2007/0235761 A1 | 10/2007 | Parikh et al. | |
| 2007/0267655 A1 | 11/2007 | Endoh et al. | 257/194 |
| 2008/0017867 A1 | 1/2008 | Spring | |
| 2008/0093626 A1* | 4/2008 | Kuraguchi | 257/190 |
| 2008/0128753 A1 | 6/2008 | Parikh et al. | |
| 2008/0296618 A1* | 12/2008 | Suh et al. | 257/190 |

OTHER PUBLICATIONS

Dora, et al., "High Breakdown Voltage Achieved on AlGaN/GaN HEMTs with Integrated Slant Field Plates," IEEE Electron Device Letters, vol. 27, No. 9, pp. 713-715, Sep. 2006.

Heikman, et al., "Non-Planar Selective Area Growth and Characterization of GaN and AlGaN," Jpn. J. Appl. Phys., vol. 42, Part 1, No. 10, pp, 6276-6283, Oct. 2003.

Kuraguchi et al., "Normally-off GaN-MISFET with Well-Controlled Threshold Voltage," Phys. Stat. Sol. (a) vol. 204, No. 6, pp, 2010-2013, 2007.

Matocha et al., "High-Voltage Normally Off GaN MOSFETs on Sapphire Substrates," IEEE Transactions on Electron Devices, vol. 52, No. 1, pp. 6-10, 2005.

Niiyama et al., "250° operation normally-off GaN MOSFETs," Solid-State Electronics, vol. 51, pp. 784-787, 2007.

Oka et al., "AlGaN/GaN Recessed MIS-Gate HFET With High-Threshold-Voltage Normally-Off Operation for Power Electronics Applications," IEEE Electron Device Letters, vol. 29, No. 7, pp. 668-670, Jul. 2008.

Suh et al., "High-Breakdown Enhancement-Mode AlGaN/GaN HEMTs with Integrated Slant Field-Plate," Proceedings from IEEE International Electron Device Meeting, pp. 911-913, 2006.

Uemoto et al., "A Normally off AlGaN/GaN Transistor with $R_{on}A=2.6\Omega cm^2$ and $BV_{ds}=640V$ Using Conductivity Modulation," Proceedings from IEEE International Electron Device Meeting, pp. 907-910, 2006.

U.S. Appl. No, 11/286,805, filed Nov. 23, 2005.

Notification of Transmittal of the International Search Report and the Written Opinion of the International Searching Authority, of the Declaration, PCT/US2009/002153, Jan. 15, 2010.

International Preliminary Report on Patentability, PCT/US2009/002153, Feb. 10, 2011.

Office Action, Chinese Patent Application No. 20098013836.3.9, Jul. 17, 2012.

Extended Search Report, European Patent Application No. 12192038.3, Mar. 4, 2013.

Office Action, Japanese Patent Application No. 2011-521088, Jun. 28, 2013.

Third Office Action, China Patent Application No. 200980138363.9, Aug. 13, 2013.

* cited by examiner

NORMALLY-OFF SEMICONDUCTOR DEVICES

CLAIM OF PRIORITY

The present application is a continuation of U.S. patent application Ser. No. 13/175,069, filed on Jul. 1, 2011 (now U.S. Pat. No. 8,198,178), which is a divisional application of U.S. patent application Ser. No. 12/183,672 (now U.S. Pat. No. 7,985,986), the disclosures of which are hereby incorporated herein by reference as if set forth fully.

STATEMENT OF U.S. GOVERNMENT INTEREST

This invention was made with Government support under Contract No. N00014-05-C-226 awarded by the Office of Naval Research. The Government has certain rights in the invention.

FIELD

The present invention relates to semiconductor devices and, more particularly, to transistors and related methods.

BACKGROUND

There is a high level of interest in wide bandgap semiconductor materials such as silicon carbide (2.996 eV for alpha SiC at room temperature) and the Group III nitrides (e.g., 3.36 eV for GaN at room temperature) for high power, high temperature and/or high frequency applications. These materials, typically, have higher electric field breakdown strengths and higher electron saturation velocities as compared to gallium arsenide and silicon.

A device of particular interest for high power and/or high frequency applications is the High Electron Mobility Transistor (HEMT), which is also known as a modulation doped field effect transistor (MODFET). These devices may offer operational advantages under a number of circumstances because a two-dimensional electron gas (2-DEG) is formed at the heterojunction of two semiconductor materials with different bandgap energies, and where the smaller bandgap material has a higher electron affinity. The 2-DEG is an accumulation layer in the undoped ("unintentionally doped"), smaller bandgap material and can contain a very high sheet electron concentration in excess of, for example, $10^{13}$ carriers/cm$^2$. Additionally, electrons that originate in the wider-bandgap semiconductor transfer to the 2-DEG, allowing a high electron mobility due to reduced ionized impurity scattering.

This combination of high carrier concentration and high carrier mobility can give the HEMT a very large transconductance and may provide a strong performance advantage over metal-semiconductor field effect transistors (MESFETs) for high-frequency applications.

High electron mobility transistors fabricated in the gallium nitride/aluminum gallium nitride (GaN/AlGaN) material system have the potential to generate large amounts of RF power because of the combination of material characteristics that includes the aforementioned high breakdown fields, their wide bandgaps, large conduction band offset, and/or high saturated electron drift velocity. In addition, a major portion of the electrons in the 2-DEG is attributed to polarization in the AlGaN. U.S. Pat. No. 6,316,793, to Sheppard et al., which is commonly assigned and is incorporated herein by reference, describes a HEMT device having a semi-insulating silicon carbide substrate, an aluminum nitride buffer layer on the substrate, an insulating gallium nitride layer on the buffer layer, an aluminum gallium nitride barrier layer on the gallium nitride layer, and a passivation layer on the aluminum gallium nitride active structure.

A HEMT can be normally-off or normally-on. Normally-off operation may be desired in transistors used as high voltage power switches, for safety reasons. Normally-off operation may also simplify bias circuitry when transistors are used in RF power amplifiers. Conventional high performance GaN power switch transistors and RF transistors are typically normally-on. Conventional normally-off HEMTs have typically resulted in devices having high on-state resistance, slow switching speed, and/or unstable device characteristics. Some of these conventional devices will be discussed below.

Conventional methods may include a Fluorine treatment after etching the gate. In particular, an AlGaN surface in the gate region may be exposed to a Fluorine-containing plasma prior to gate metallization. As discussed in *High-performance enhancement-mode AlGaN/GaN HEMTs using fluoride-based plasma treatment* by Cai et al. (IEEE Electron Device Letters, Vol. 26, No. 7, p. 435, 2005), the threshold voltage of the device can be shifted to positive values (normally-off) by Fluorine plasma exposure. This method has been adapted to GaN power switch transistors as discussed in, for example, *High-Breakdown Enhancement-Mode AlGaN/GaN HEMTs with Integrated Slant Field-Plate* by C. S. Suh et al., (Proceedings from IEEE International Electron Device Meeting 2006, p. 911). When these methods are used, the threshold voltage may not be stable under stress and may shift toward more negative values. Furthermore, the threshold voltages achieved may be barely positive. To account for sub-threshold leakage, process variability, and noise immunity in applications, Vt>+1V is typically desired.

Further conventional devices may include a P-type AlGaN or GaN cap. In particular, P-type doped material (GaN or AlGaN) may be formed on an upper surface of the AlGaN barrier layer in the gate region. As discussed in *A Normally-off AlGaN/GaN Transistor with RonA=2.6 mΩcm2 and BVds=640V using Conductivity Modulation* by Y. Uemoto et al (Proceedings from IEEE International Electron Device Meeting 2006, p. 907), these devices may have low on-resistances and high breakdown voltages. However, since p-type doping in GaN and AlGaN typically does not have a shallow acceptor level, charging and depletion of the acceptors during normal device operation may be too slow to respond at MHz switching speeds. This can result in increased dynamic on-resistance when the device is operated at high switching speeds.

Conventional MOSFETs may be fabricated from an unintentionally doped GaN film. As discussed in, for example, *250 C operation normally-off GaN MOSFETs* by Y. Niiyama et al. (Solid-State Electronics vol. 51, p. 784, 2007), these devices closely mimic a Si MOSFET structure. In particular, source and drain contacts are formed on n$^+$ implanted regions. A positive gate bias above the threshold voltage may induce an electron inversion layer in the p-type buffer (or semi-insulating buffer). The mobility of the inversion layer may be low due to interface scattering, which may lead to a high on-state resistance of the device.

It is understood that with a precisely controlled etch rate, an AlGaN layer that is originally around 250 Å could be etched leaving about 25 Å in the gate region. Depositing gate metal on this thin remaining AlGaN layer may produce a normally-off device. This process is extremely sensitive to the recess etch depth, and is therefore not practical.

Recess etching into a double channel structure is discussed by M. Kuraguchi et al., (Phys. Stat. Sol. (a) Vol. 204, No. 6, p. 2010, 2007). A device formed on a double channel epitaxial structure, (AlGaN/GaN/AlGaN/GaN) is discussed, where a gate trench is etched through the upper AlGaN layer stopping inside the underlying GaN layer. After etching the gate trench, a dielectric layer and a gate metal are deposited. A GaN/AlGaN/GaN structure is therefore provided under the gate, where the thickness and Al composition of the AlGaN layer is such that substantially no electrons are accumulated at the lower AlGaN/GaN interface at zero bias. The threshold voltage is typically not sensitive to the gate trench etch depth, but transport properties in the on-resistance state may be. If the GaN thickness immediately under the gate dielectric is too thick, then electrons may accumulate at the dielectric/GaN interface instead of the lower AlGaN/GaN interface under the gate in the device on-state. This may lead to a lower electron mobility and a higher device on-resistance.

SUMMARY

Some embodiments of the present invention provide transistors including a Group III-nitride buffer layer and a Group III-nitride barrier layer on the Group III-nitride buffer layer. A non-conducting spacer layer is provided on the Group III-nitride barrier layer. The Group III-nitride barrier layer and the spacer layer define a trench extending through the barrier layer and exposing a portion of the buffer layer. A gate structure is provided on the spacer layer and in the trench and a gate electrode on the gate structure.

In further embodiments of the present invention, the trench may be further defined by the buffer layer. The transistor may further include a second non-conducting spacer layer on the gate electrode and the dielectric layer and a field plate on the second non-conducting spacer. The field plate may be electrically coupled to a source electrode or the gate electrode. The second non-conducting spacer may have a thickness of from about 500 Å to about 5000 Å.

In still further embodiments of the present invention, the trench may be further defined by the buffer layer. The transistor may further include a thin GaN layer having a thickness of from about 2.0 to about 50.0 Å between the trench and the gate structure.

In some embodiments of the present invention, the gate structure may include a dielectric layer and the dielectric layer has a thickness of from about 60 Å to about 600 Å.

In further embodiments of the present invention, the trench may be further defined by the buffer layer and the gate structure may include an aluminum nitride (AlN) layer on the spacer layer and in the trench and a dielectric layer on the AlN layer. The AlN layer may have a thickness of from about 1.0 Å to about 10.0 Å. In certain embodiments, the AlN layer may be an Aluminum Gallium Nitride (AlGaN) layer. A thin gallium nitride (GaN) layer having a thickness of from about 2.0 to about 50.0 Å may be provided between the AlN layer and the trench.

In still further embodiments of the present invention, the gate structure may include a gallium nitride (GaN) layer on the MN layer, the GaN layer may be between the dielectric layer and the AlN layer. The GaN layer may have a thickness of from about 2.0 Å to about 30 Å. A thin gallium nitride (GaN) layer having a thickness of from about 2.0 to about 50.0 Å may be provided between the AlN layer and the trench.

In some embodiments of the present invention, the first non-conducting spacer may include silicon nitride and may have a thickness of from about 300 Å to about 3000 Å.

In further embodiments of the present invention, the gate electrode may have a length of from about 0.5 µm to about 5.0 µm.

In still further embodiments of the present invention, the transistor may be a normally-off High Electron Mobility Transistor (HEMT).

Some embodiments of the present invention provide transistors including a Group III-nitride barrier layer and a non-conducting spacer layer on the Group III-nitride barrier layer. The spacer layer defines a trench extending through the spacer layer and exposes a portion of the barrier layer. A gate implant region is provided in a portion of the barrier layer. A gate electrode is provided in the trench on the implanted region and on the spacer layer.

In further embodiments of the present invention, dielectric sidewall spacers may be provided on a sidewall of the trench. The implant region may have an implant dose of from about $5.0 \times 10^{12}$ cm$^{-2}$ to about $1.0 \times 10^{14}$ cm$^{-2}$. The dielectric sidewall spacers may have a thickness of from about 1.0 nm to about 50.0 nm.

In still further embodiments of the present invention, the transistor may further include a second non-conducting spacer layer on the gate electrode and the spacer layer and a field plate on the second non-conducting spacer. The field plate may be electrically coupled to a source electrode or the gate electrode. The second non-conducting spacer may have a thickness of from about 500 Å to about 5000 Å.

In some embodiments of the present invention, the trench may extend into the barrier layer. The trench may extend from about 0 Å to about 200 Å into the barrier layer.

Although some embodiments of the present invention are primarily discussed above with respect to transistor embodiments, corresponding methods are also provided herein.

DETAILED DESCRIPTION OF EMBODIMENTS OF THE INVENTION

Figure 1A:
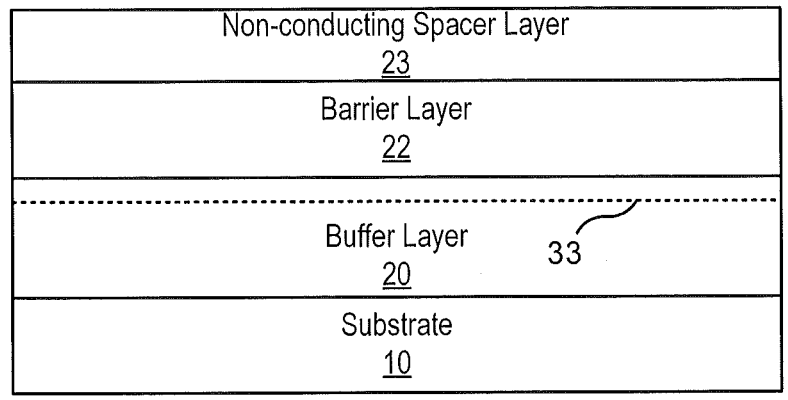
FIGS. 1A-1D are cross sections illustrating processing steps in the fabrication of semiconductor devices according to some embodiments of the present invention.

Embodiments of the present invention now will be described more fully hereinafter with reference to the accompanying drawings, in which embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. Like numbers refer to like elements throughout. Furthermore, the various layers and regions illustrated in the figures are illustrated schematically. Accordingly, the present invention is not limited to the relative size, spacing and alignment illustrated in the accompanying figures. As will also be appreciated by those of skill in the art, references herein to a layer formed "on" a substrate or other layer may refer to the layer formed directly on the substrate or other layer or on an intervening layer or layers formed on the substrate or other layer. It will also be appreciated by those of skill in the art that references to a structure or feature that is disposed "adjacent" another feature may have portions that overlap or underlie the adjacent feature.

Relative terms such as "below" or "above" or "upper" or "lower" or "horizontal" or "vertical" may be used herein to describe a relationship of one element, layer or region to another element, layer or region as illustrated in the figures. It will be understood that these terms are intended to encompass different orientations of the device in addition to the orientation depicted in the figures.

Embodiments of the invention are described herein with reference to cross-section illustrations that are schematic illustrations of idealized embodiments (and intermediate structures) of the invention. The thickness of layers and regions in the drawings may be exaggerated for clarity. Additionally, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a discrete change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" "comprising," "includes" and/or "including" when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms used herein should be interpreted as having a meaning that is consistent with their meaning in the context of this specification and the relevant art and will not be interpreted in an idealized or overly formal sense unless expressly so defined herein.

Embodiments of the present invention may be particularly well suited for use in nitride-based HEMTs such as Group III-nitride based devices. As used herein, the term "Group III nitride" refers to those semiconducting compounds formed between nitrogen and the elements in Group III of the periodic table, usually aluminum (Al), gallium (Ga), and/or indium (In). The term also refers to ternary and quaternary compounds such as AlGaN and AlInGaN. As is well understood by those in this art, the Group III elements can combine with nitrogen to form binary (e.g., GaN), ternary (e.g., AlGaN, AlInN), and quaternary (e.g., AlInGaN) compounds. These compounds all have empirical formulas in which one mole of nitrogen is combined with a total of one mole of the Group III elements. Accordingly, formulas such as $Al_xGa_{1-x}N$ where $0 \leq x \leq 1$ are often used to describe them.

While embodiments of the present invention are described in connection with GaN HEMT devices, the present invention may be employed in connection with other types of devices and/or materials. For example, embodiments of the invention may also be particularly suited for use in silicon carbide MESFET devices. Likewise, some embodiments of the invention may be advantageously employed in GaN-based light emitting devices (LEDs), as well as in GaAs-based devices such as GaAs/AlGaAs pHEMT devices.

A high breakdown device with low on-resistance typically has low resistance in regions between the gate and the source and between the gate and the drain, while at the same time allowing channel depletion in the region between gate and drain. The regions between the gate and the source and between the gate and the drain will be referred to herein as "access regions." The high mobility and high charge density of an AlGaN/GaN or AlGaN/AlN/GaN structure may be suited for this, and has been used to demonstrate high performance normally-on devices as discussed in, for example, *High Breakdown Voltage Achieved on AlGaN/GaN HEMTs With Integrated Slant Field Plates* (IEEE Electron Device letters, vol. 27, no. 9, p. 713, 2006). The same layer structure cannot typically be used in the gate region when normally-off operation is desired. Accordingly, some embodiments of the present invention provide normally-off devices and methods of fabricating the same having low resistance access regions as will be discussed further herein with respect to FIGS. 1A through 10.

Normally-off devices may be used for applications such as power switches. Normally-off devices are inherently safer for power switch/power supply applications because the current provided during a power up sequence will not cause the device to blow up the system, like a normally-on device may experience. Thus, some embodiments of the present invention provide GaN HEMT devices capable of normally-off operation and having a metal-insulator-semiconductor gate structure. As discussed above, normally-off operation is desired in transistors used as high voltage power switches for safety reasons. Normally-off operation may also simplify bias circuitry when transistors are used in RF power amplifiers. Conventional high performance GaN power switch transistors and RF transistors are typically normally-on. As discussed above, conventional devices that achieve normally-off operation have typically resulted in high on-state resistance, slow switching speed, and/or unstable device characteristics. Thus, according to some embodiments of the present invention, a normally-off GaN HEMT is provided with performance comparable to normally-on devices.

As will be discussed in detail below with respect to FIGS. 1 through 6C, in some embodiments of the present invention a GaN HEMT epitaxial wafer including a two dimensional electron gas (2-DEG) between a GaN buffer layer and a barrier layer is capped with a non-conducting spacer layer. A barrier layer structure, for example, AlGaN/GaN is provided in the access regions of the device. A spacer layer is provided on an upper surface of the barrier layer. In the gate region of the device, a trench is etched through the spacer and the barrier layer, exposing a portion of the GaN buffer layer. Regrowth of, for example, a thin AlN/GaN stack and a dielectric layer is performed, followed by the deposition of a metal gate electrode. The thin AlN/GaN stack is designed such that substantially no charge is induced under the gate at zero gate bias, providing the device with normally-off characteristics. Under a positive gate bias, electrons may accumulate at the interface between the AlN layer and the underlying GaN buffer. The electrons have high mobility typical of semiconductor heterointerfaces, resulting in a low on-state resistance. Since the layers that form the gate structure are formed separately from the layers that form the access region, each layer structure can be optimized separately to achieve desired device characteristics as will be discussed further herein.

Processing steps in the fabrication of semiconductor devices in accordance with some embodiments of the present invention will be discussed with respect to FIGS. 1A through 1D. Referring first to FIG. 1A, a substrate 10 is provided on which nitride based devices may be formed. In some embodiments of the present invention, the substrate 10 may be a semi-insulating silicon carbide (SiC) substrate that may be, for example, 4H polytype of silicon carbide. Other silicon carbide candidate polytypes include the 3C, 6H, and 15R polytypes. The term "semi-insulating" is used in a relative rather than absolute sense. In particular embodiments of the present invention, the silicon carbide bulk crystal has a resistivity equal to or higher than about $1 \times 10^5$ Ω-cm at room temperature.

Optional buffer, nucleation and/or transition layers (not shown) may be provided on the substrate 10. For example, an AlN buffer layer may be provided to provide an appropriate crystal structure transition between the silicon carbide substrate and the remainder of the device.

Silicon carbide has a much closer crystal lattice match to Group III nitrides than does sapphire ($Al_2O_3$), which is a very common substrate material for Group III nitride devices. The closer lattice match may result in Group III nitride films of higher quality than those generally available on sapphire. Silicon carbide also has a very high thermal conductivity so that the total output power of Group III nitride devices on silicon carbide is, typically, not as limited by thermal dissipation of the substrate as in the case of the same devices formed on sapphire. Also, the availability of semi-insulating silicon carbide substrates may provide for device isolation and reduced parasitic capacitance. Appropriate SiC substrates are manufactured by, for example, Cree, Inc., of Durham, N.C., the assignee of the present application.

Although silicon carbide may be used as a substrate material, embodiments of the present invention may utilize any suitable substrate, such as sapphire, aluminum nitride, aluminum gallium nitride, gallium nitride, silicon, GaAs, LGO, ZnO, LAO, InP and the like without departing from the scope of the present invention. In some embodiments, an appropriate buffer layer also may be formed.

Returning to FIG. 1A, a buffer (channel) layer 20 is formed on the substrate 10. The buffer layer 20 may be formed on the substrate 10 using buffer layers, transition layers, and/or nucleation layers as described above. The buffer layer 20 may be under compressive strain. Furthermore, the channel layer and/or buffer nucleation and/or transition layers may be epitaxially grown by metal-organic chemical vapor deposition (MOCVD) or by other techniques known to those of skill in the art, such as molecular beam epitaxy (MBE), hydride vapor phase epitaxy (HYPE) or other suitable techniques.

In some embodiments of the present invention, the buffer layer 20 is a Group III-nitride, such as $Al_xGa_{1-x}N$ where 0≤x<1, provided that the energy of the conduction band edge of the buffer layer 20 is less than the energy of the conduction band edge of the barrier layer 22 at the interface between the channel and barrier layers. In certain embodiments of the present invention, x=0, indicating that the buffer layer 20 is GaN. The buffer layer 20 may also include other Group III-nitrides such as InGaN, AlInGaN or the like without departing from the scope of the present invention. The buffer layer 20 may be undoped ("unintentionally doped") and may be grown to a thickness of from about 0.5 μm to about 10 μm. The buffer layer 20 may also be a multi-layer structure, such as a superlattice or combinations of GaN, AlGaN or the like without departing from the scope of the present invention.

A barrier layer 22 is formed on the buffer layer 20. The barrier layer 22 may have a bandgap that is greater than the bandgap of the buffer layer 20 and the barrier layer 22 may also have a smaller electron affinity than the buffer layer 20. Thus, a two-dimensional electron gas (2-DEG) 33 is formed at the heterojunction of two semiconductor materials (barrier layer 22 and buffer layer 20) with different bandgap energies, and where the smaller bandgap material has a higher electron affinity. The 2-DEG 33 is an accumulation layer in the undoped ("unintentionally doped"), smaller bandgap material and can contain a very high sheet electron concentration in excess of, for example, $10^{13}$ carriers/cm². Additionally, electrons that originate in the wider-bandgap semiconductor transfer to the 2-DEG, allowing a high electron mobility due to reduced ionized impurity scattering.

The barrier layer 22 may be epitaxially grown directly on the buffer layer 20. In certain embodiments of the present invention, the barrier layer 22 includes AlN, AlInN, AlGaN and/or AlInGaN with a thickness of from about 100 Å to about 700 Å. In some embodiments, the barrier layer 22 may include $Al_xGa_{1-x}N$ where 0≤x<0.32. In particular embodiments, x=0.22.

While embodiments of the present invention are described herein with reference to particular HEMT structures, the present invention should not be construed as limited to such structures. For example, additional layers may be included in the HEMT device while still benefiting from the teachings of the present invention. Such additional layers may include a GaN cap layer on the barrier layer 22. Furthermore, the barrier layer 22 may also be provided with multiple layers. Thus, embodiments of the present invention should not be construed as limiting the barrier layer to a single layer but may include, for example, barrier layers having combinations of GaN, AlGaN and/or AlN layers. For example, a GaN, AlN structure may be utilized to reduce or prevent alloy scattering. Thus, embodiments of the present invention may include nitride based barrier layers, such nitride based barrier layers may include AlGaN based barrier layers, AlN based barrier layers and combinations thereof.

In particular embodiments of the present invention, the barrier layer 22 is thick enough and has a high enough Al composition and doping to induce a significant carrier concentration at the interface between the buffer layer 20 and the barrier layer 22 through polarization effects when the barrier layer 22 is buried under ohmic contact metal.

As noted above, the barrier layer 22 may have a bandgap larger than that of the buffer layer 20 and a smaller electron affinity than the buffer layer 20. Accordingly, in certain embodiments of the present invention, the barrier layer 22 may include AlGaN, AlInGaN and/or AlN or combinations of layers thereof. The barrier layer 22 should not be so thick as to cause cracking or substantial defect formation therein. In certain embodiments of the present invention, the barrier layer 22 is undoped or doped with an n-type dopant to a concentration less than about $1 \times 10^{19}$ cm$^{-3}$. In some embodiments of the present invention, the barrier layer 22 includes $Al_xGa_{1-x}N$ where $0<x<=1$. In particular embodiments, the aluminum concentration may be about 25%. However, in other embodiments of the present invention, the barrier layer 22 comprises AlGaN with an aluminum concentration of between about 5% and about 100%. In some embodiments of the present invention, the aluminum concentration is greater than about 10%.

As further illustrated in FIG. 1A, a first non-conducting spacer layer 23 may be formed on the barrier layer 22. The first non-conducting spacer layer may include, for example, silicon nitride. The first non-conducting spacer layer may have a thickness of from about 300 Å to about 3000 Å.

Figure 1B:
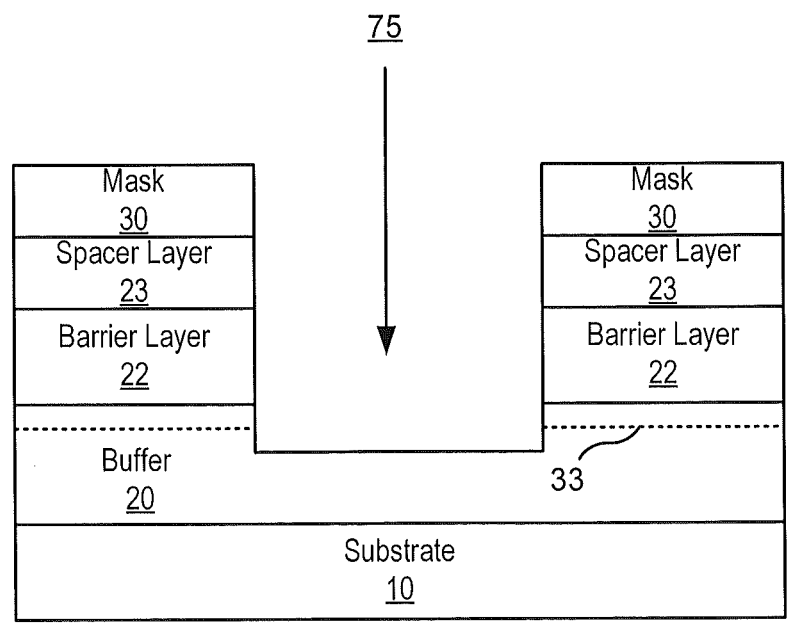

Referring now to FIG. 1B, the spacer layer 23, the barrier layer 22 and the buffer layer are patterned and etched using a mask 30. The mask 30 may include a photoresist and/or a metal, and may be patterned using conventional photolithographic/liftoff techniques without departing from the scope of the present invention. In particular, buffer layer 20, the barrier layer 22 and the spacer layer 23 are etched to form a trench 75. As illustrated, the trench extends through the spacer layer 23 and the barrier layer 22 and into the buffer layer 20 exposing a portion of the buffer layer. In some embodiments, the trench 75 may extend from about 50 to about 500 Å into the buffer layer 20. The etch time may be adjusted such that the process will terminate when the trench 75 has extended into the buffer layer 20 in the acceptable range.

Figure 1C:
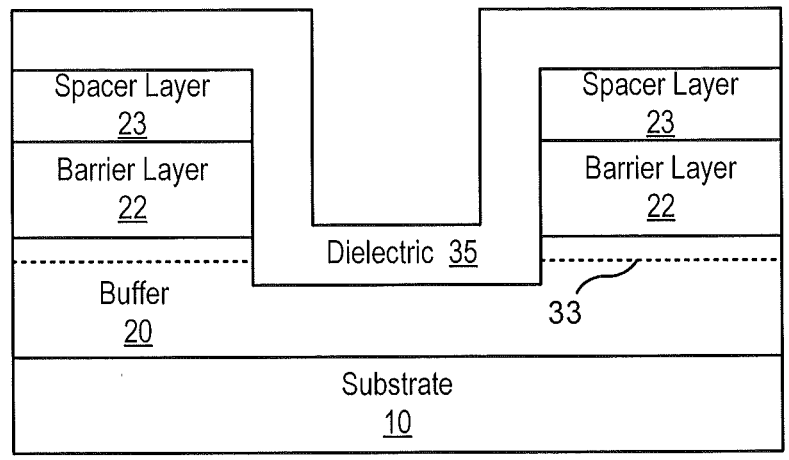

Referring now to FIG. 1C, the mask 30 is removed and a gate structure 435 (FIG. 4) is formed on the trench and on the spacer layer. In embodiments of the present invention illustrated in FIG. 1C, the gate structure is a dielectric layer 35. However, as will be discussed further below with respect to FIGS. 2 and 3, the gate structure 435 (FIG. 4) is not limited to this configuration.

Figure 4:
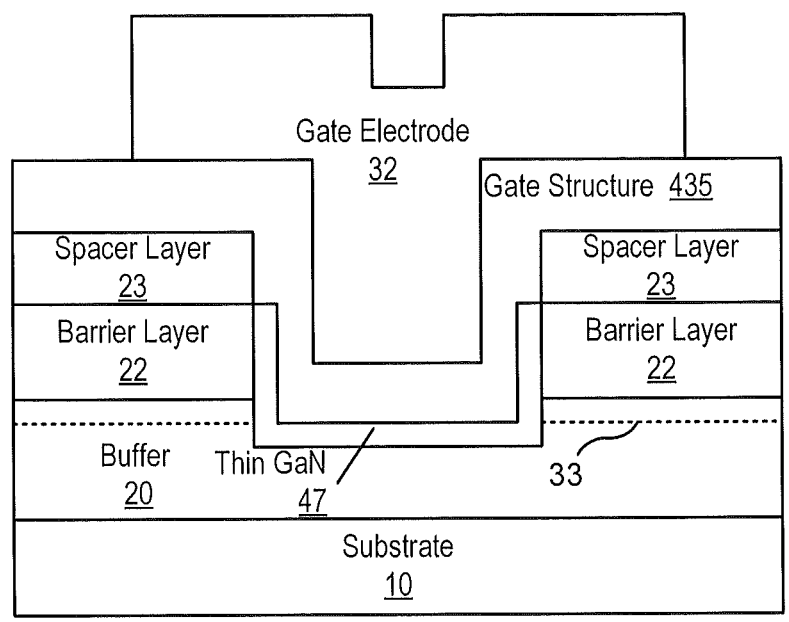

Referring to FIG. 4, in some embodiments of the present invention, the formation of the gate structure 435 is preceded by the formation of an optional thin GaN layer 47. After etching the trench 75, the exposed surface of the buffer layer 20 may be rough. This rough surface is the surface which, after the deposition of the gate structure 435, forms the interface where electrons are accumulated in the on-state of the device. Roughness of this interface can lead to lower electron mobility and higher device on-resistance. Thus, according to some embodiments of the present invention, a thin GaN layer 47 is formed (deposited) in the trench 75 prior to the formation of the gate structure 435. The thin GaN layer 47 may grow on the buffer layer 20 and sidewalls of the barrier layer 22, but will typically not grow on the spacer layer 23. In some embodiments, the thin GaN layer may be grown using metalorganic chemical vapor deposition (MOCVD) at a temperature of from about 600 to about 1200° C. However, embodiments of the present invention are not limited to this formation process. When the thin GaN layer 47 is deposited, the roughness caused by the trench etch can be recovered into step-flow morphology typical of as-grown GaN. The thin GaN layer 47 may have a thickness of from about 2.0 Å to about 50 Å.

Referring again to FIG. 1C, as discussed above, in embodiments of the present invention illustrated in FIG. 1C, the gate structure 435 (FIG. 4) is provided by a dielectric layer 35. Thus, if the structure of FIG. 1C included the thin GaN layer 47 to recover the surface smoothness, the thin GaN layer 47 would be provided between the trench 75 and the dielectric layer 35. The dielectric layer may have a thickness of from about 60 Å to about 600 Å.

The dielectric layer 35 may include silicon nitride ($Si_xN_y$), silicon dioxide ($SiO_2$), AlSiN, and/or another suitable dielectric material, such as silicon oxynitride (SiON). It will be understood that the terms "$Si_xN_y$," "SiN" and "silicon nitride" are used herein interchangeably to refer to both stoichiometric and non-stoichiometric silicon nitride. Other materials may also be utilized for the dielectric layer 35. For example, the dielectric layer 35 could also include magnesium oxide, scandium oxide, aluminum oxide and/or aluminum oxynitride. Furthermore, the dielectric layer 35 may be a single layer or may include multiple layers of uniform and/or non-uniform composition. The material of the dielectric layer 35 should be capable of withstanding relatively high temperatures.

In general, the dielectric layer 35 may be a dielectric layer that has a relatively high breakdown field strength and that provides a relatively low interface trap density at the interface with an underlying Group III-nitride layer such as the buffer layer 20. The dielectric layer 35 may not be reactive to the material of the barrier layer 22. Moreover, the dielectric layer 35 may have a relatively low level of impurities therein. For example, the dielectric layer 35 may have a relatively low level of hydrogen and other impurities, including oxygen, carbon, fluorine and chlorine. In addition, the dielectric layer 35 may be stable at relatively high temperatures (e.g. >1000° C.) in order to withstand high annealing temperatures used in subsequent process steps.

In particular embodiments of the present invention, the dielectric layer 35 includes SiN. The SiN dielectric layer 35 may be formed, for example, by Chemical Vapor Deposition (CVD). The SiN dielectric layer 35 may be stoichiometric (i.e. the ratio of silicon to nitrogen in the material is about 3:4). The stoichiometry of a SiN layer may be adjusted, for example, by adjusting the relative flow rates of $SiH_4$ and $NH_3$ source gases in a CVD process. Moreover, when formed at relatively high temperatures, CVD-grown SiN tends to be stoichiometric.

The stoichiometry of a SiN layer may also affect the index of refraction of the layer. In certain embodiments of the present invention, a SiN dielectric layer 35 may have an index of refraction at a 633 nm wavelength of from about 1.6 to about 2.2. In particular embodiments, the index of refraction of a SiN dielectric layer 35 is 1.98±0.05 as measured by ellipsometry. Stoichiometric SiN may also be characterized by its etch rate in a buffered oxide etch (BOE). For example, the etch rate of stoichiometric SiN in BOE is nearly zero.

In some embodiments, the dielectric layer 35 may be $SiO_2$. The $SiO_2$ may be formed by LPCVD and/or MOCVD and may be stoichiometric. In certain embodiments of the present invention, an $SiO_2$ protective layer may have an index of refraction at a 633 nm wavelength of from about 1.36 to about 1.56. In particular embodiments, the index of refraction of an $SiO_2$ protective layer is 1.46±0.03 as measured by ellipsometry.

When the dielectric layer 35 includes silicon nitride, the dielectric layer 35 may have impurity levels at or below the levels shown in Table 1, as measured by secondary ion mass spectroscopy (SIMS) with a Cs ion beam.

TABLE 1

| Element | Concentration (cm$^{-3}$) |
| --- | --- |
| H | $4 \times 10^{21}$ |
| O | $3 \times 10^{18}$ |
| C | $7 \times 10^{17}$ |
| F | $1 \times 10^{16}$ |
| Cl | $4 \times 10^{16}$ |

The dielectric layer may include a high purity SiN layer as described in U.S. patent application Ser. No. 11/286,805 entitled "GROUP III NITRIDE SEMICONDUCTOR DEVICES WITH SILICON NITRIDE LAYERS AND METHODS OF MANUFACTURING SUCH DEVICES" filed Nov. 23, 2005, the disclosure of which is incorporated herein by reference as if fully set forth herein. In particular, pursuant to certain embodiments of the present invention, a SiN dielectric layer 35 may be grown using LPCVD or MOCVD at relatively high temperatures (e.g., above about 700° C.). In particular embodiments, the SiN layers may be grown at a temperature in the range of about 900-1000° C. Such high temperature growth may also facilitate reducing the impurity levels in the SiN layer. Additionally, high growth rates may be employed which may facilitate reducing the levels of background reactor impurities incorporated into the SiN layer. For example, in certain embodiments of the present invention, the SiN layer(s) may be grown at a growth rate of at least about 0.2 microns/hour. In some embodiments, the growth rate may be about 2 microns/hour.

Figure 6A:
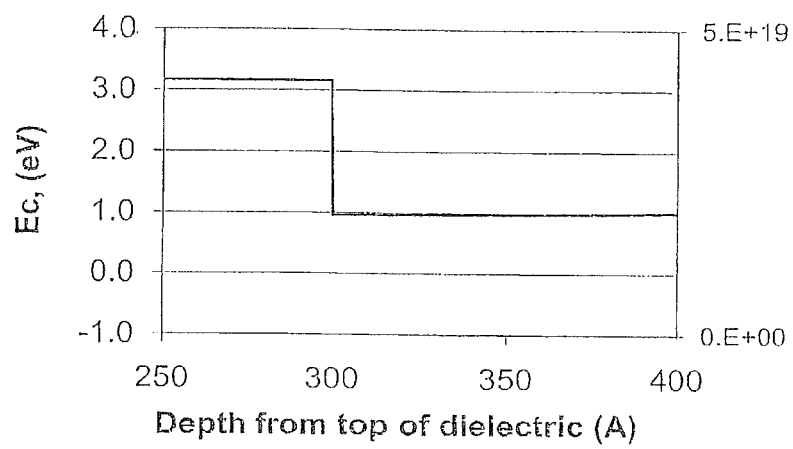
FIGS. 6A through 6C are various graphs illustrating performance characteristics in accordance with some embodiments of the present invention.
Figure 6A:
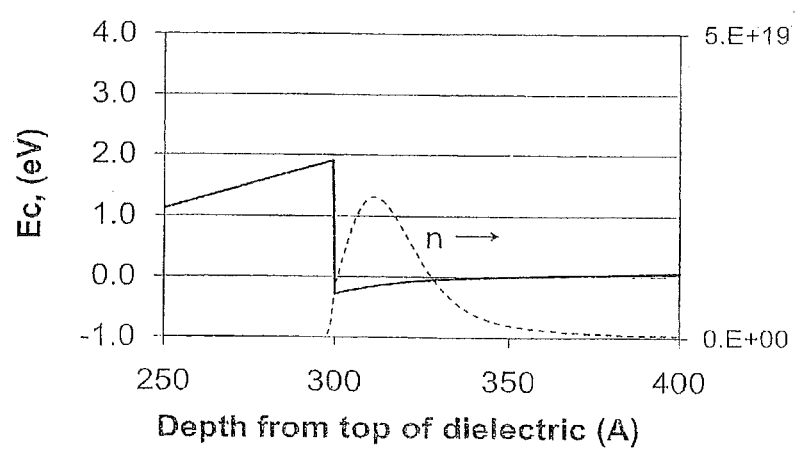

Graphs illustrating a simulated conduction band edge in the off- and on-state of a device including a dielectric layer 35 having a thickness of about 300 Å according to some embodiments of the present invention are provided in FIG. 6A. As discussed above, in the device on-state, the electrons accumulate at the dielectric-semiconductor interface. These electrons presumably have a low mobility, due to the proximity to the dielectric layer 35. This can have an adverse effect on the overall device on-resistance. However, if the gate length is sufficiently short compared to the length of the access region, the high resistance under the gate may not substantially increase the on-resistance of the device.

After formation of the dielectric layer, source 30 and drain contacts (FIGS. 5A and 5B) are formed. The source 30 and drain 31 contacts can be formed using any method known to those having skill in the art. For example, a mask may be formed on the spacer layer 23, and windows may then be opened in the mask for the source and drain contacts 30 and 31. The mask may include SiO$_2$, metal, photoresist or any other suitable mask material.

Figure 5A:
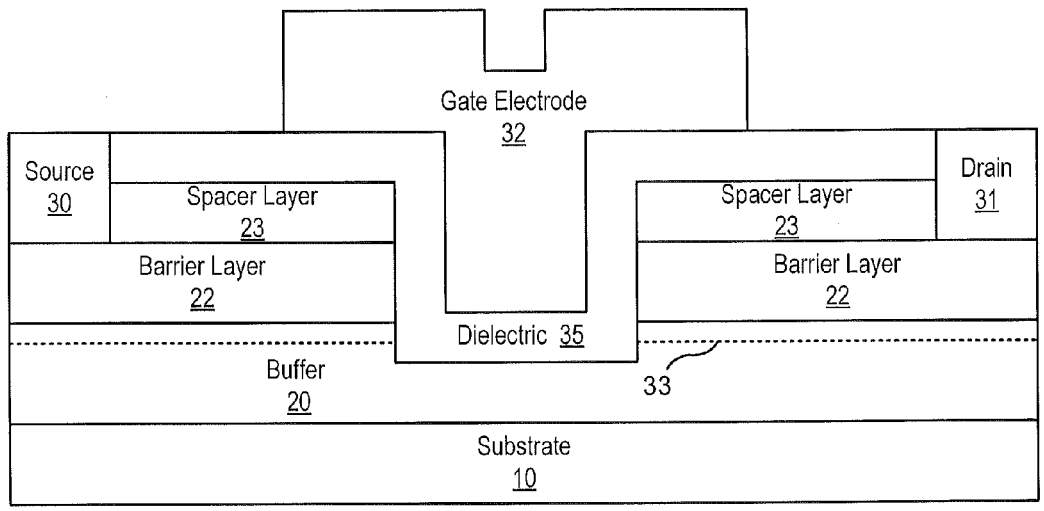
FIGS. 5A and 5B are cross sections illustrating semiconductor devices according to some embodiments of the present invention.
Figure 5B:
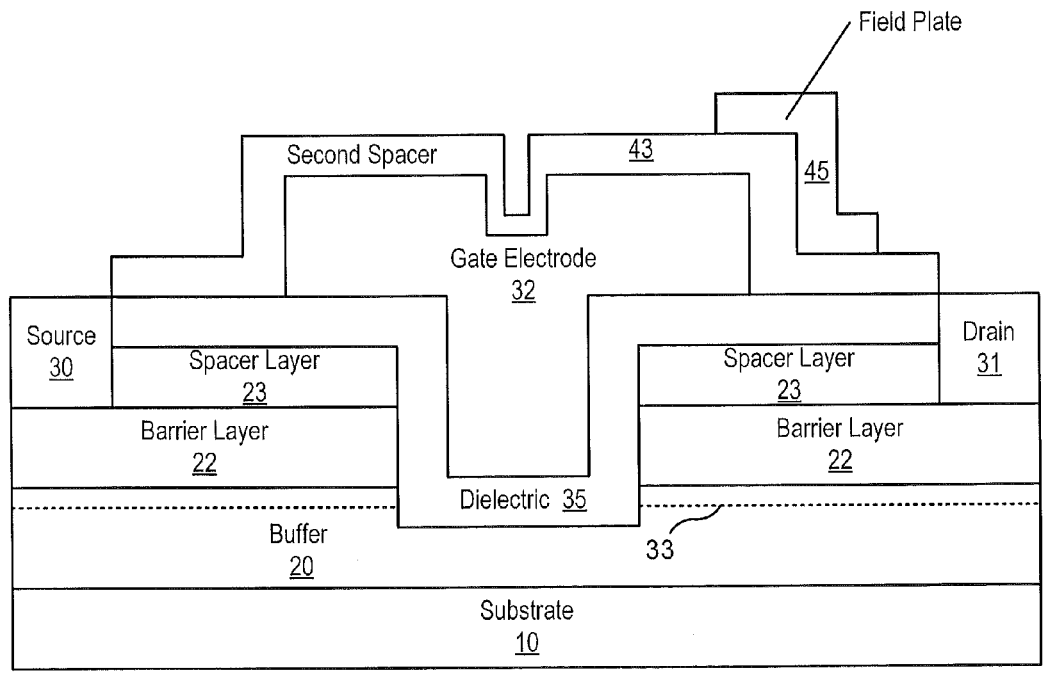

A metal layer may then be deposited, for example by evaporation, on the mask and on the portions of the barrier layer 22 exposed by the mask to provide the source and drain contacts 30, 31. Suitable metals may include Ti, Si, Ni, Au, Al, Ta, Mo, TiN, WSiN, and/or Pt. In particular embodiments, the metal can include a stack of Ti (250 Å), Al (1000 Å) and Ni (500 Å) formed in order on the substrate. The mask may then be lifted off, leaving source and drain contacts 30 and 31 on the source and drain regions as illustrated in FIGS. 5A and 5B. The source and drain contacts 30 and 31 may be ohmic contacts without departing from the scope of the present invention.

In some embodiments, the deposited metal may be annealed to reduce the contact resistance of the source and drain contacts 30 and 31. The anneal may be an anneal at a temperature from about 600 to about 1200° C. in an atmosphere of an inert gas such as N$_2$ or Ar. Through the use of an ohmic contact anneal, the resistance of the ohmic contacts may be reduced from a relatively high resistance to about 1 Ω-mm or less. Thus, as used herein, the term "ohmic contact" refers to a non-rectifying contact that has a contact resistance of about 1 Ω-mm or less.

Figure 1D:
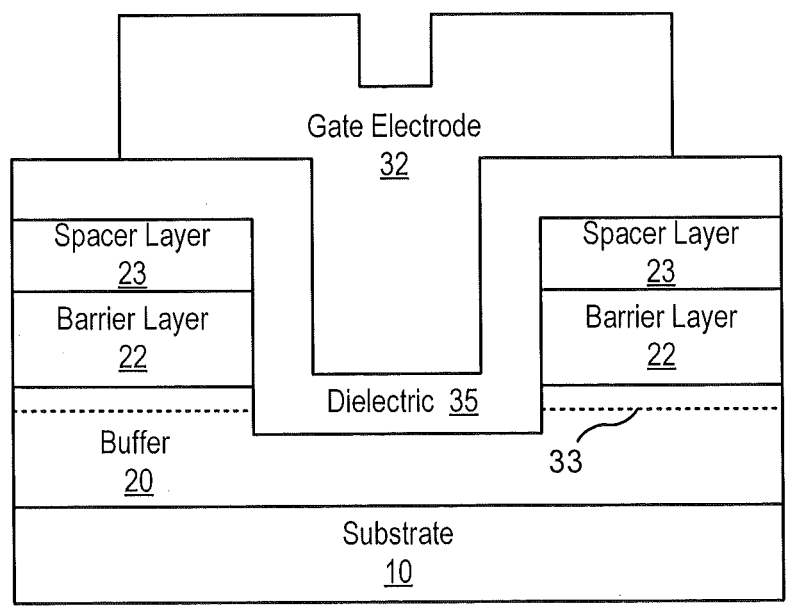

Referring now to FIG. 1D, the gate electrode 32 may be formed after annealing the source and drain contacts discussed above. The gate electrode 32 may not be annealed. As illustrated in FIG. 1D, the gate electrode 32 is formed in the trench 75 on the dielectric layer 35 and the spacer layer 23. The gate electrode 32 may have a gate length of from about 0.5 μm to about 5.0 μm. The gate electrode 32 may be a "T" gate as illustrated in FIG. 1D and may be fabricated using conventional fabrication techniques. Suitable gate materials may include conventional materials capable of making a Schottky contact to a nitride based semiconductor material, such as Ni, Pt, NiSi$_x$, Cu, Pd, Cr, W and/or WSiN. Suitable gate materials may also include materials not capable of making a Schottky contact to a nitride based semiconductor material, such as Ti, Al and/or TiW.

Accordingly, some embodiments of the present invention provide a device with low resistance access regions combined with normally-off operation. As discussed above, some embodiments of the present invention provide a barrier layer structure 22, for example AlGaN/GaN in the access regions, with a spacer layer 23 thereon. In the gate region, a trench 75 is etched through the spacer layer 23 and the barrier layer 22, exposing the buffer layer 20. One or more layers (such as dielectric layer 35 of FIG. 1C) are deposited in the gate region to form a gate structure 35 with the desired threshold voltage and lateral transport properties. Since the layers making up the gate structure are deposited separately from the layers making up the access region, each layer structure can be optimized separately to achieve desired device characteristics.

Figure 2:
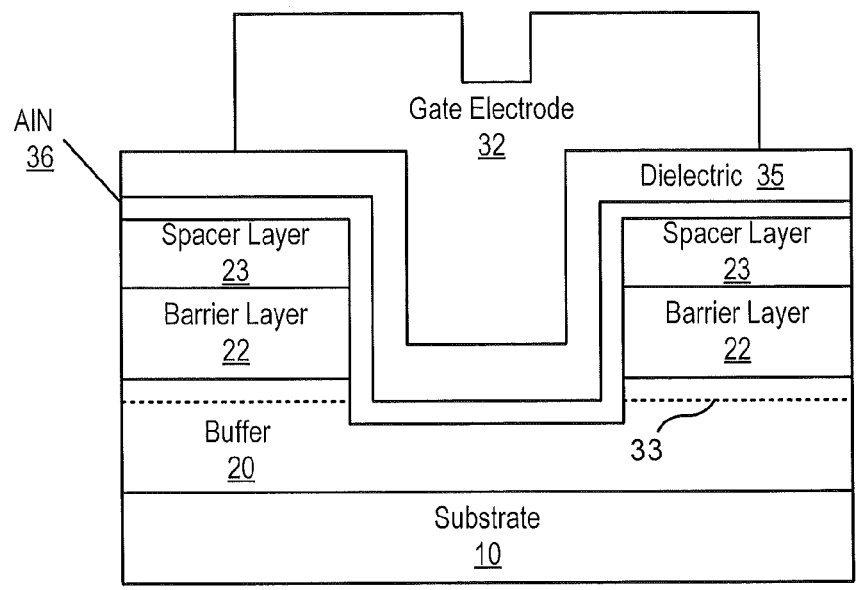
FIGS. 2 through 4 are cross sections illustrating semiconductor devices according to some embodiments of the invention.

Referring now to FIG. 2, in some embodiments of the present invention the gate structure 435 (FIG. 4) includes an additional AlN layer 36 between the trench 75 and dielectric layer 35. As illustrated in FIG. 2, the AlN layer 36 on the spacer layer 23 and in the trench 75 is formed before the dielectric layer 35 and the dielectric layer 35 is formed on the AlN layer 36. The AlN layer 36 may have a thickness of from about 1.0 Å to about 10.0 Å. In some embodiments of the present invention, the AlN layer 36 may be replaced with a thicker AlGaN layer and still achieve nearly equivalent results. However, when depositing the AlGaN layer compositional control may be difficult. Under conditions where GaN deposition is selective, the Al composition in an AlGaN layer may not be uniform. Furthermore, in embodiments where the thin GaN layer 47 is included for smoothing surface roughness as discussed above, the thin GaN layer 47 would be formed between the MN layer 36 and the trench 75/spacer layer 23.

Figure 6B:
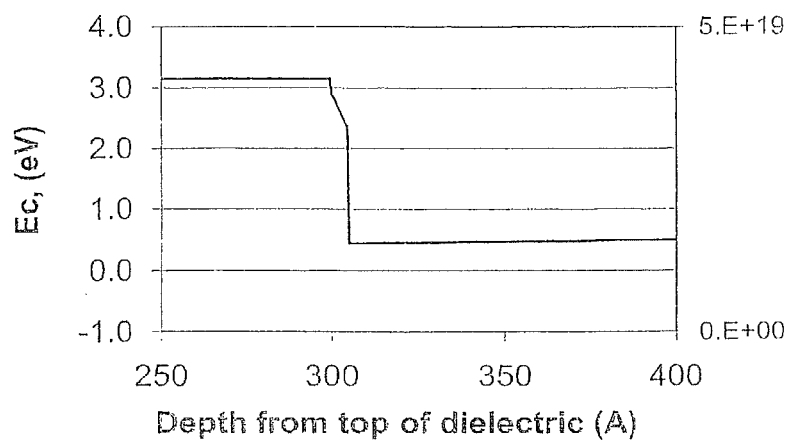
Figure 6B:
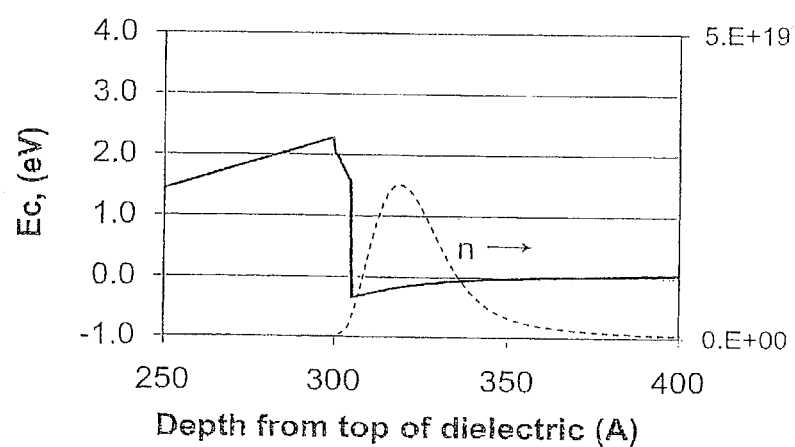

Graphs illustrating simulated conduction band edge in the off- and on-state of a device including an AlN layer 36 with a thickness of about 5 Å and dielectric layer 35 with a thickness of about 300 Å are provided in FIG. 6B. In the device on-state, the electrons accumulate at the AlN/GaN interface. The AlN layer may be crystalline, and the AlN/GaN may form a semiconductor heterostructure with higher electron mobility than what can be expected with respect to embodiments discussed above with respect to having the dielectric layer 35 alone. This may lead to a lower device on-resistance. The electron mobility may increase as the thickness of the AlN layer 36 increases, as this separates the accumulated electrons further from the AlN/dielectric interface. However, with increasing thickness of the AlN layer 36 the threshold voltage may be reduced, due to the strong polarization-induced electric fields in the AlN layer 36.

Figure 3:
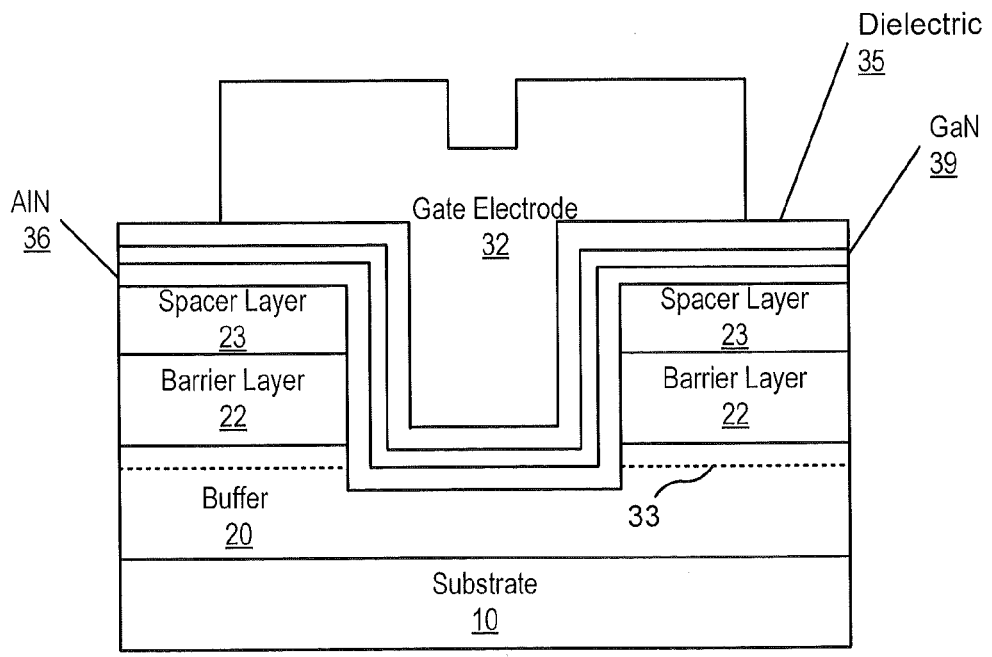

Referring now to FIG. 3, in some embodiments of the present invention, the gate structure 435 (FIG. 4) includes a GaN layer 39 in between the AlN layer 36 and the dielectric layer 35. As illustrated in FIG. 3, the GaN layer 39 is formed on the AlN layer 36, between the dielectric layer 35 and the AlN layer 36. The GaN layer 39 may have a thickness of from about 2.0 Å to about 30 Å. Furthermore, in embodiments where the thin GaN layer 47 is included for smoothing surface roughness as discussed above, the thin GaN layer 47 would be formed between the AlN layer 36 and the trench 75/spacer layer 23.

Figure 6C:
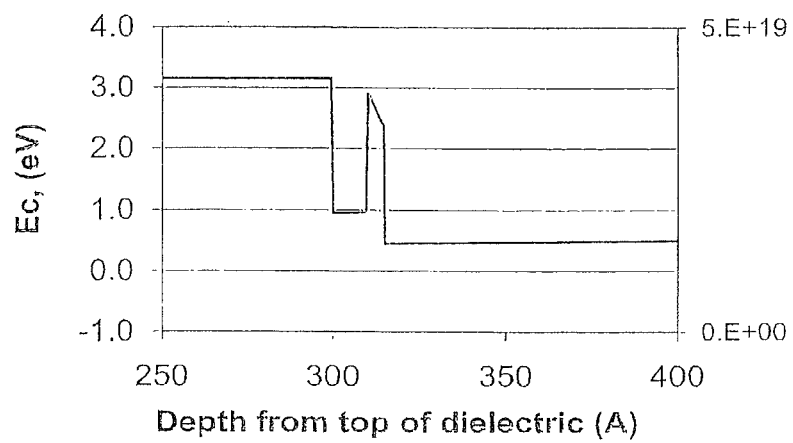
Figure 6C:
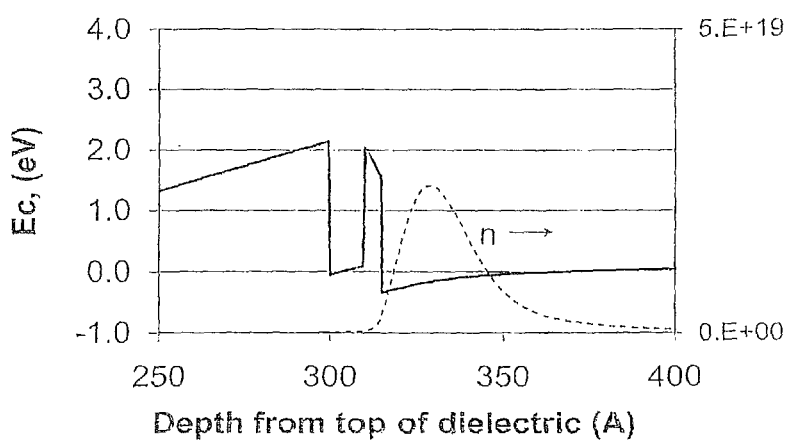

Graphs illustrating simulated conduction band edge in the off- and on-state, of a device with an AlN layer 36 having a thickness of about 5 Å, a GaN layer 39 with a thickness of about 10 Å, and a dielectric layer 35 having a thickness of about 300 Å are illustrated in FIG. 6C. In the device on-state, the electrons accumulate at the lower AlN/GaN interface. However, the accumulated electrons are further separated from the dielectric layer in the device of FIG. 3, which may result in higher electron mobility and lower device on-resistance. The electron mobility may increase with the thickness of the GaN layer 39 and the AlN layer 36, as this separates the accumulated electrons further from the dielectric layer 35. However, if the thickness of the GaN layer 39 exceeds a certain threshold thickness, electrons may start to accumulate at the GaN-dielectric interface instead of at the lower AlN/GaN interface, and this may lead to a reduction in the electron mobility.

In embodiments of the present invention discussed above with respect to FIGS. 1A through 4, deposition of the gate structure 435 (FIG. 4) is not selective, i.e. the gate structure is deposited in the etched gate trench 75 as well as on the spacer layer 23 in the access regions, and on the side walls of the gate trench 75. In some embodiments of the present invention, the deposition of the AlN layer 36 and the dielectric layer 35 may be performed as discussed above, however, the deposition of the GaN layer 39 when such a layer is part of the gate structure, may be selective, i.e. depositing the GaN in only in the etched gate trench 75, depending on the deposition technique and the deposition conditions. In embodiments of the present invention using selective deposition of the GaN layer 39, the non-conducting spacer layer 23 may be etched through in large areas outside the active device prior to the deposition of the GaN layer 39. Thus, GaN can also be deposited in the etched large areas outside the active device, possibly providing more predictable and controllable deposition rates in the gate trench 75.

Referring now to FIGS. 5A and 5B, in some embodiments of the present invention, the gate electrode 32 is situated between the source and the drain contacts 30 and 31 in a typical GaN HEMT device configuration. As further illustrated in FIG. 5B, in some embodiments of the present invention a second non-conducting spacer layer 43 is provided on the gate electrode 32. In some embodiments, a second spacer layer 43 may be deposited after the gate metallization and may have a thickness of from about 500 Å to about 5000 Å. Suitable materials for the spacer layer 43 may include, for example, silicon nitride. The formation of the second non-conducting spacer layer 43 may be followed by the deposition of a metal field plate 45 on a drain side of the device. Suitable materials for the field plate 45 may include, for example, Ni, Au, Al and Ti. The field plate 45 may be connected to the gate electrode 32 or the source electrode 30 without departing from the scope of the present invention. FIG. 5B only illustrates some embodiments of the present invention, it will be understood that other configurations and geometries of gate electrode 32 and the field plate 45 may also be possible.

Some embodiments of the present invention provide a GaN HEMT device capable of normally-off operation that includes an ion-implanted region in the barrier layer beneath the gate electrode as will be discussed further below with respect to FIGS. 7A through 10. The implanted elements serve to bend the conduction band under the gate electrode such that substantially no mobile charge may be present in the channel under the gate electrode at zero gate bias. At a positive gate bias, electrons typically accumulate in the channel at the interface between the barrier layer and the underlying buffer layer. According to some embodiments of the present invention including the ion-implanted region, the implanted elements may be predominantly located in the barrier layer, and a relatively low concentration of the implanted elements may be found in the buffer and at the interface. Thus, the accumulated electrons may not be affected by scattering due to the implanted ions, which may result in a device having high mobility and a low on-state resistance.

As discussed above, normally-off operation is desired in transistor used as high voltage power switches for safety reasons, among others. Furthermore, normally-off devices, in conjunction with normally-on devices, may allow fabrication of GaN HEMT direct-coupled FET (enhancement/depletion mode logic) logic circuits, the digital circuit family that is now most popular for GaAs high complexity, low-power circuits. Normally-off operation may also simplify bias circuitry for transistors used in RF power amplifiers. High performance GaN power switch transistors and RF transistors reported to date are typically normally-on. Conventional approaches to achieve normally-off operation have resulted in high on-state resistance, slow switching speeds and/or unstable device characteristics. Some embodiments of the present invention provide normally-off devices having performance comparable with normally-on devices as will be discussed below with respect to FIGS. 7A through 10.

Figure 7A:
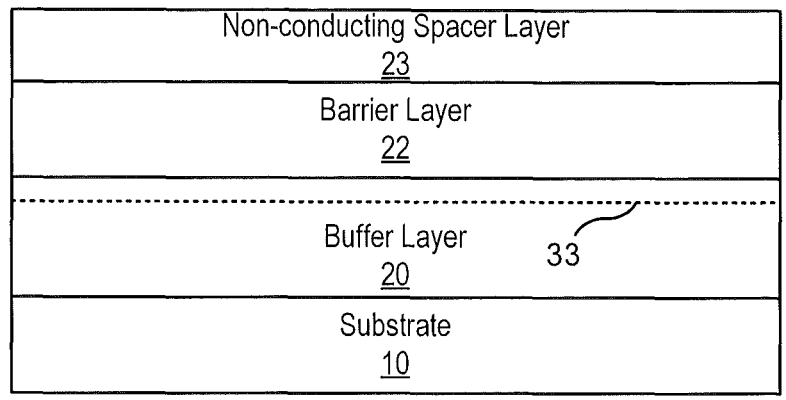
FIGS. 7A through 7E are cross sections illustrating processing steps in the fabrication of semiconductor devices according to some embodiments of the present invention.

Processing steps in the fabrication of semiconductor devices in accordance with some embodiments of the present invention will be discussed with respect to FIGS. 7A through 7E. Referring first to FIG. 7A, the substrate 10, buffer layer 20, barrier layer 22 and spacer layer 23 are formed using similar processing steps as discussed above with respect to FIG. 1A. Furthermore, the two-dimensional electron gas (2-DEG) 33 is formed at the heterojunction of two semiconductor materials (barrier layer 22 and buffer layer 20) with different bandgap energies, and where the smaller bandgap material has a higher electron affinity as also discussed above with respect to FIG. 1A. Accordingly, details with respect to the formation of these elements will not be discussed further herein.

Figure 7B:
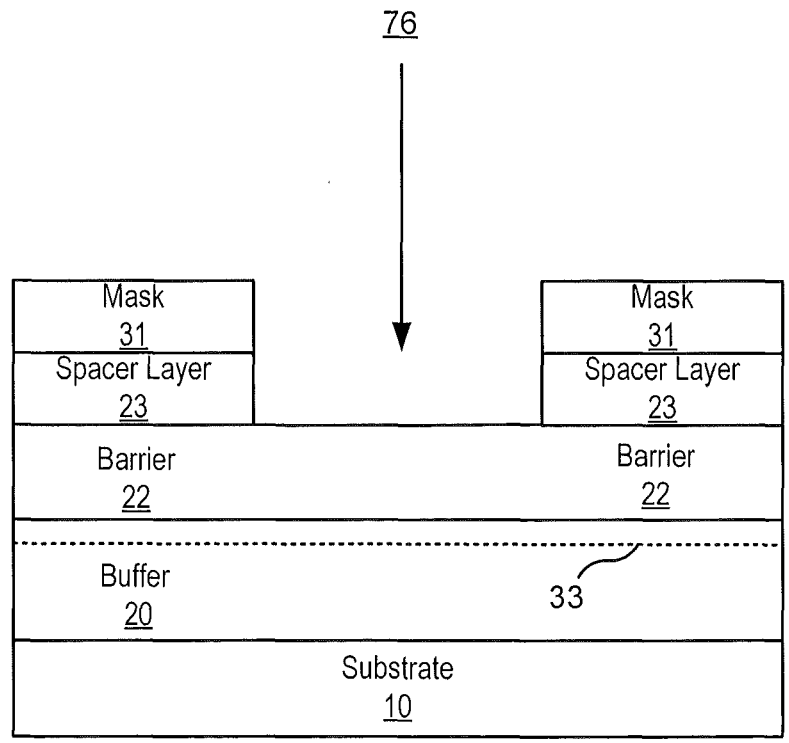

Referring now to FIG. 7B, the spacer layer 23 is patterned and etched using a mask 31. The mask 31 may include a photoresist and/or a metal, and may be patterned using conventional photolithographic/liftoff techniques without departing from the scope of the present invention. In particular, the spacer layer 23 is etched to form a trench 76. As illustrated, the trench extends through the spacer layer 23 and exposes a portion of the barrier layer 22. In some embodiments of the present invention, the barrier layer 22 may be etched during formation of the trench 76. In these embodiments, the trench 76 may extend from about 0 Å to about 200 Å into the barrier layer 22.

Figure 7C:
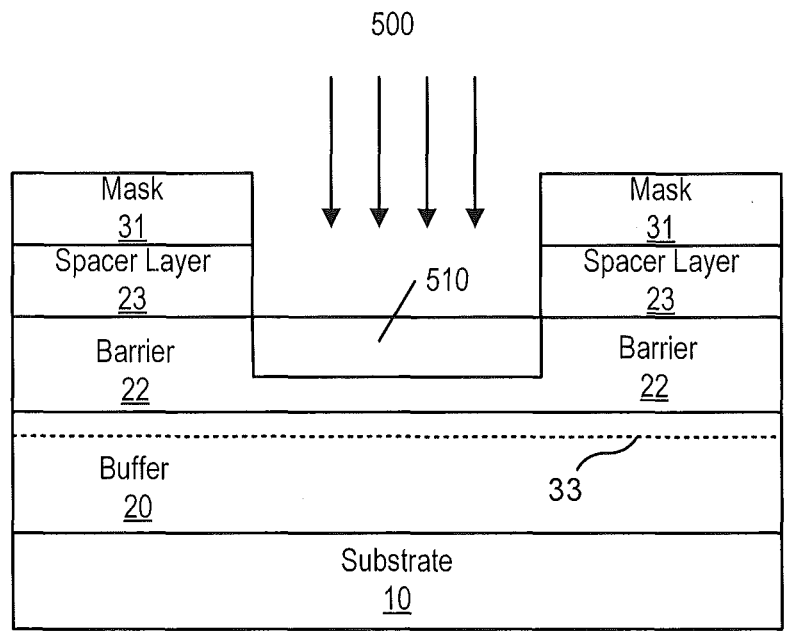

Referring now to FIG. 7C, with the mask 31 still in place, ions 500 are implanted into the surface of the barrier layer 22 exposed by the etch of the trench 76 to provide a gate implant region 510. In some embodiments of the present invention, the implant energy may be chosen so that the resulting distribution of implanted elements may be predominantly located in the barrier layer 22, and limiting the concentration of implanted elements that extend into the buffer layer 20 to very low levels. Thus, the structural damage associated with the ion implantation may be reduced near the interface between the barrier layer 22 and the buffer 20, near the 2-DEG 33. Accordingly, high mobility may be may be provided in the 2-DEG 33.

In particular, the implanted element (ions) may be chosen such that it results in negative space charge once implanted into the barrier layer 22. One possible implant element may include Magnesium (Mg). Mg, if situated on a group III lattice site in an AlGaN layer, serves as an acceptor, which may result in negative space charge when depleted. Other suitable implant elements may include, for example, Fluorine (F) or zinc (Zn). The implant energy may be from about 3.0 keV to about 10 kEV. The implant dose may be chosen such that the band bending shifts the threshold voltage to a positive value. Suitable implant doses may be, for example, from about from about $5.0 \times 10^{12}$ cm$^{-2}$ to about $1.0 \times 10^{14}$ cm$^{-2}$. There is a limit to how far positive the threshold voltage can be shifted. When a certain implant dose is exceeded, the resulting band bending can cause the valence band in the barrier layer 22 to cross the Fermi-level at zero gate bias. This may lead to hole formation, which may cause device dispersion and/or threshold voltage drift during device operation.

Figure 7D:
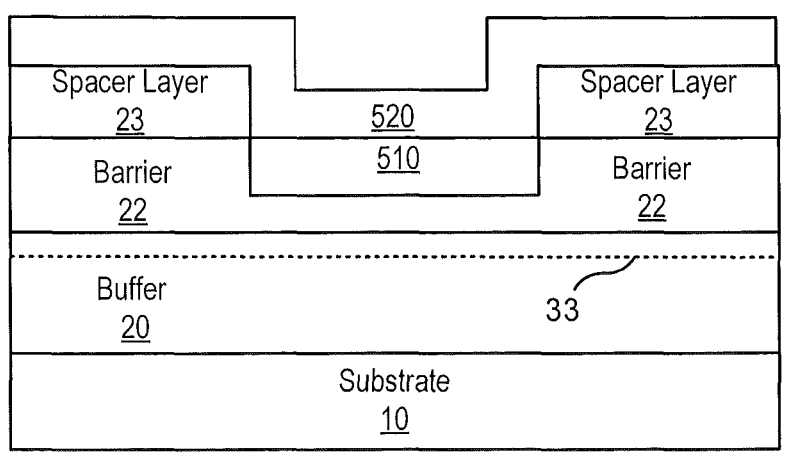

After the ions 500 are implanted to form the implanted gate region 510, the implanted gate region 510 may be annealed to recover lattice damage caused by the implant. The anneal may also serve to move the implanted elements into electrically active lattice sites, for example, from an interstitial site to a Group-III site in an AlGaN layer. The implant anneal may be performed at a temperature of from about 1000° C. to about 1300° C., which is near or above the typical MOCVD growth temperature for AlGaN and GaN. The implant anneal may be performed for from about 30 seconds to about 10 minutes. In some embodiments of the present invention, the implant anneal may be performed in an ammonia containing atmosphere. This may reduce the likelihood that any exposed AlGaN or GaN surfaces will decompose. Furthermore, as illustrated in FIG. 7D, in some embodiments of the present invention, an encapsulation layer 520 may be deposited on a surface of the device prior to the anneal to further reduce the likelihood that exposed surfaces will decompose. It will be understood that either the ammonia, the encapsulation layer 520 or both can be used without departing from the scope of the present invention.

After the implant anneal, or as a separate anneal, a lower temperature activation anneal may be performed in an atmosphere designed to remove hydrogen form the implanted gate region 510. This activation anneal may be similar to activation anneals performed for Mg-doped GaN. As-grown MOCVD Mg-doped GaN is not p-type. However, when annealed at a temperature of from about 600 to about 900° C. for from about 1.0 minute to about 1.0 hour in a pure $N_2$ or $N_2/O_2$ atmosphere, the as-grown GaN can be rendered p-type by removing the hydrogen from the GaN.

Source and drain contacts 30 and 31 (FIGS. 9A and 9B) may be formed before or after the implant anneal and the activation anneal in accordance with some embodiments of the present invention. In particular, if the implant anneal and/or activation anneal temperatures exceed a maximum threshold of the ohmic contact metals, the typical fabrication sequence has to be modified. Ohmic contact metal is typically formed before the gate process is performed, as discussed above. On the other hand, if the ohmic contact process includes an ion implantation and implant anneal, then the gate implant anneal and the ohmic implant anneal may be performed at the same time, followed by the ohmic contact metal deposition. Source and drain contacts 30 and 31 (FIGS. 9A and 9B) may be formed using a similar process as discussed above with respect to FIGS. 5A and 5B and, therefore, details of the formation thereof will not be discussed further herein.

Figure 7E:
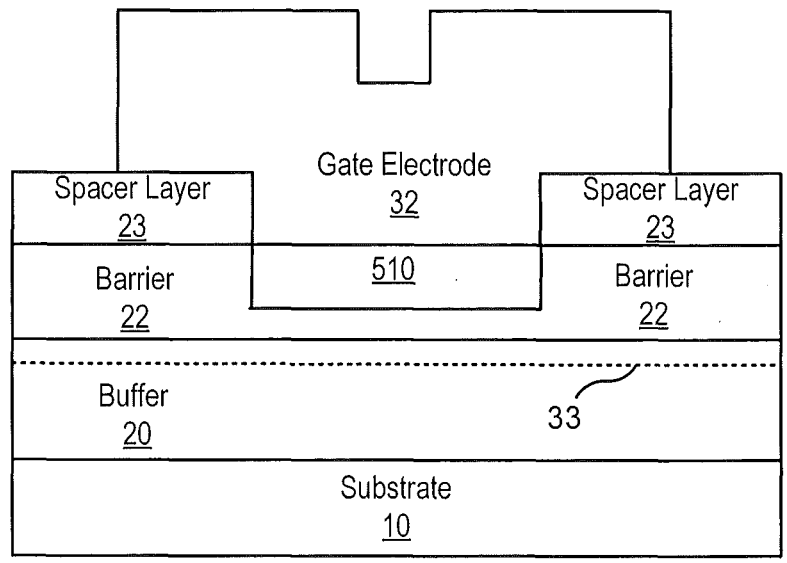

Referring now to FIG. 7E, the gate electrode 32 may be formed after forming the implanted gate region 510 and the annealing processes discussed above. The gate electrode 32 may not be annealed. As illustrated in FIG. 7E, the gate electrode 32 is formed in the trench 76 on the implanted gate region 510 and the spacer layer 23. The gate electrode 32 may have a gate length of from about 0.5 μm to about 5.0 μm. The gate electrode 32 may be a "T" gate as illustrated in FIG. 7E and may be fabricated using conventional fabrication techniques. Suitable gate materials may include conventional materials capable of making a Schottky contact to a nitride based semiconductor material, such as Ni, Pt, NiSi$_x$, Cu, Pd, Cr, W and/or WSiN.

Furthermore, that gate metal area, defined by a lift-off technique, may include the gate implant region 510, but may also extend onto a surface of the spacer layer 23 on both sides of the implant region 510. The gate metal in contact with the surface of the barrier layer 22, defined by the etched opening in the spacer layer 23, may thus be self-aligned to the gate implant region 510.

Figure 10:
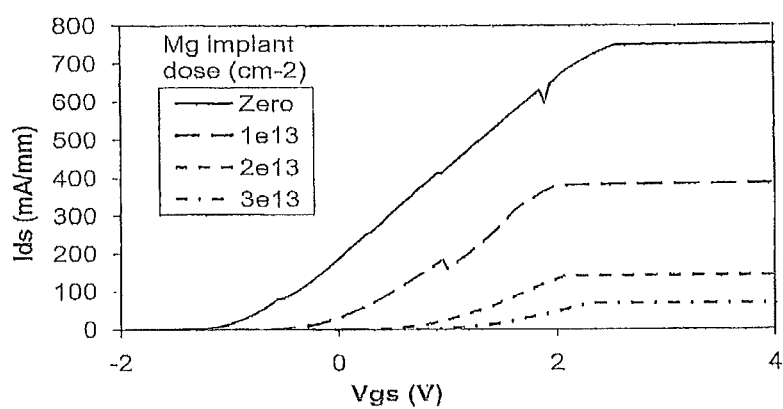
FIG. 10 is a graph illustrating performance characteristics in accordance with some embodiments of the present invention.

Referring now to FIG. 10, a graph illustrating measurements of drain current on devices with Mg-implanted gates will be discussed. In particular, in some embodiments of the present invention, the dopant ions have an implant energy of about 8 keV and a dose of about $2.0 \times 10^{13}$ cm$^{-3}$. The dopant ions may include magnesium. The implanted dopant ions may be annealed for about 1 minute at a temperature of from about 1130° C. After the implant anneal, an activation anneal of the implanted dopant ions may be preformed for 15 minutes at a temperature of from about 700° C. in an atmosphere containing about 80 percent $N_2$ and 20 percent $O_2$. In these embodiments, the epitaxial structure of the device may be an $Al_{0.2}Ga_{0.8}N$ layer having a thickness of about 250 Å, a AlN layer having a thickness of about 3.0 Å and a GaN layer having a thickness of about 1.4 μm on a silicon carbide substrate. FIG. 10 illustrated drain current versus gate bias for devices having different Mg implant doses. At the implant dose of $2.0 \times 10^{13}$ cm$^{-3}$ discussed above, the threshold voltage was +0.5V.

It will be understood that the values discussed above with respect to FIG. 10 are provided for example purposes only and, therefore, embodiments of the present invention are not limited to these values. For example, in some embodiments of the present invention, the dopant ions may have an implant energy of about 5 keV and a dose of about $3.0 \times 10^{13}$ cm$^{-2}$, the dopant ions may be Zinc (Zn) and the implant may be annealed for about 1 minute at a temperature of about 1170° C. without departing from the scope of the present invention.

Figure 8:
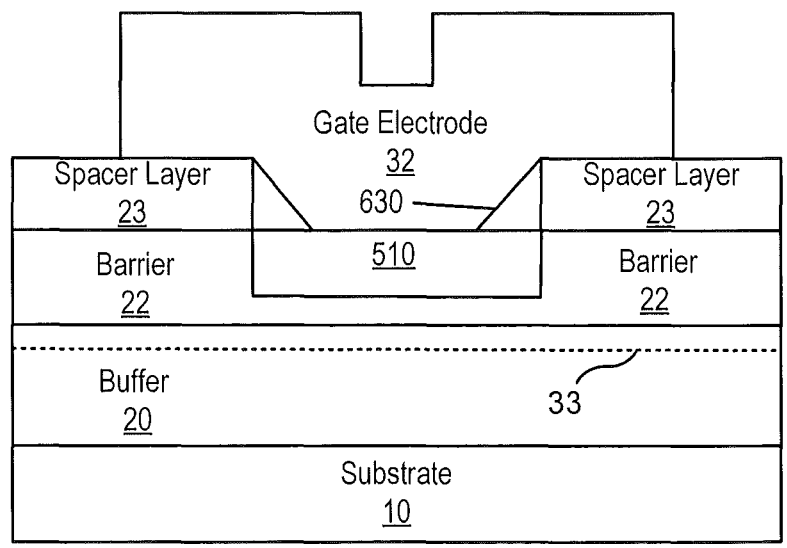
FIGS. 8 through 9B are cross sections illustrating semiconductor devices according to some embodiments of the invention.

Referring now to FIG. 8, a cross-section illustrating semiconductor devices according to some embodiments of the invention will be discussed. The device of FIG. 8 is similar to the device discussed above with respect to FIGS. 7A through 7E, but further includes dielectric sidewall spacers 630 on a sidewall of the trench 76. The sidewall spacers 630 may be formed after the gate implant 510 discussed above is performed. The dielectric sidewall spacers 630 may have a thickness of from about 1.0 nm to about 50.0 nm. If the thickness of the sidewall spacers 630 is too thick, the gate electrode 32 when positively biased, may not accumulate mobile charge under the implanted region 510, which may result in current choking at the gate edges.

In some embodiments, a conformal dielectric layer may be formed on the semiconductor device and the conformal dielectric layer may be etched to provide the dielectric sidewall spacers 630 on the sidewall of the trench 76. In some embodiments of the present invention, the conformal dielectric layer may be etched using a highly anisotropic reactive ion etch of the conformal dielectric layer. Thus, when the gate is forward biased, the structure discussed above with respect to FIGS. 7A through 7E may provide a possible leakage path from the gate metal to the 2-DEG 33 via the non-implanted barrier 22 adjacent the gate implant region 510. The sidewalls 630 of FIG. 8 may separate the gate metal from the non-implanted barrier layer 22, which may substantially reduce or possibly eliminate the parasitic leakage path that may occur in embodiments discussed above with respect to FIGS. 7A through 7E. The device of FIG. 8 including the dielectric sidewalls 630 can therefore be biased to a higher gate voltage, which may result in a higher maximum drain current and a lower on-resistance.

Figure 9A:
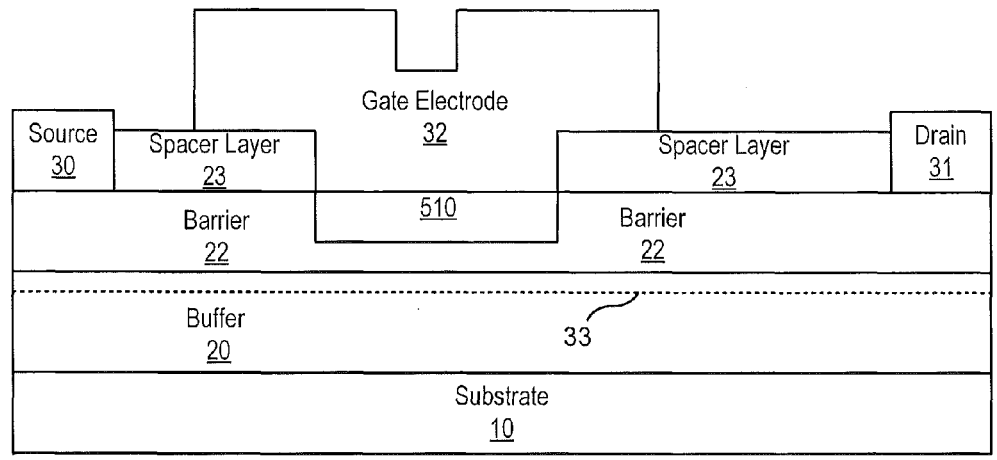
Figure 9B:
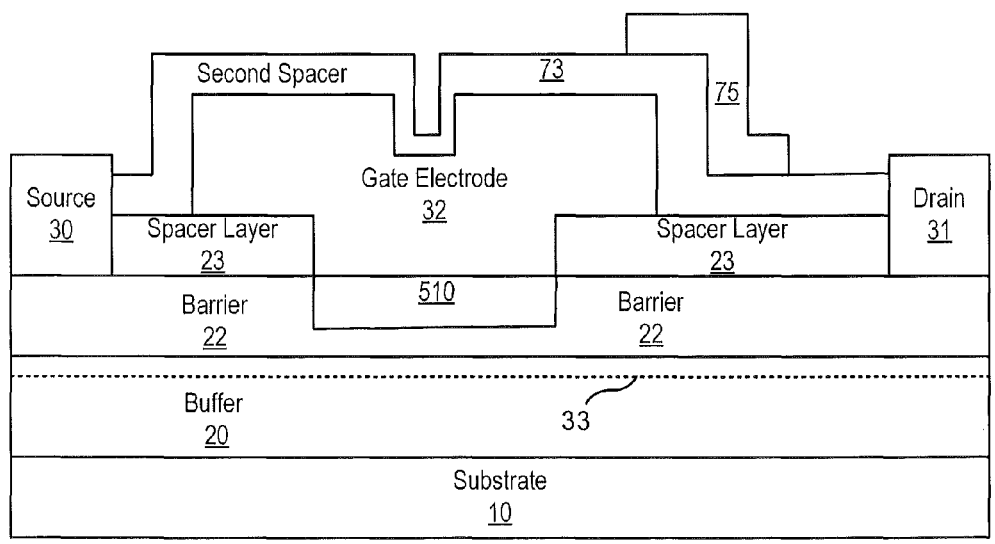

Referring now to FIGS. 9A and 9B, cross-sections of devices according to some embodiments of the present invention will be discussed. As illustrated in FIGS. 9A and 9B, the gate electrode 32 is situated between the source 30 and the drain 31 contact. FIG. 9B further illustrates the formation of a second non-conducting spacer layer 73. The second non-conducting spacer 73 may have a thickness of from about 500 Å to about 5000 Å. The second non-conducting spacer layer 73 may be deposited after formation of the gate electrode 32. The formation of the second non-conducting spacer layer 73 may be followed by the formation of a metal field plate 75. The metal field plate 75 may be connected to either the gate 32 of the source 30 without departing from the scope of the present invention. Suitable materials for the field plate 75 may include, for example, Ni, Au, Al and Ti. FIG. 9B only illustrates some embodiments of the present invention, it will be understood that other configurations and geometries of gate electrode 32 and the field plate 75 may also be possible.

Accordingly, some embodiments of the present invention provide a device with low resistance access regions combined with normally-off operation. As discussed above, some embodiments of the present invention provide an implanted region 510 in the barrier layer 22 under the gate electrode 32. The presence of the implanted region 510 may bend the conduction band under the gate electrode 32 such that no mobile charge is present in the channel under the gate electrode at zero bias. At a positive gate bias, electrons accumulate in the channel at the interface between the barrier layer 22 and the underlying GaN buffer 20. Since the implanted elements are predominantly located in the barrier layer 22, and relatively low concentrations are present in the GaN buffer 20 and at the interface, the accumulated electrons may not be affected by scattering due to the implanted ions, which may provide a device having high mobility and a low on-state resistance as discussed above with respect to FIGS. 7A through 10. Accordingly, some embodiments of the present invention may provide normally-off operation of GaN HEMTs with performance comparable to normally-on devices.

Although certain structures of GaN HEMTs are discussed above, these structures are provided herein to provide examples only. The gate structure and/or gate implant region discussed herein in accordance with some embodiments of the present invention may be included in any HEMT having any structure that will provide a functional device without departing from the scope of the present invention.

In the drawings and specification, there have been disclosed typical embodiments of the invention, and, although specific terms have been employed, they have been used in a generic and descriptive sense only and not for purposes of limitation.

That which is claimed is:

1. A transistor, comprising:
   a Group III-nitride buffer layer;
   a Group III-nitride barrier layer on the Group III-nitride buffer layer;
   a non-conducting spacer layer on the Group III-nitride barrier layer, the Group III-nitride barrier layer and the spacer layer including a trench;
   a conformal dielectric layer on the spacer layer and the barrier layer and in the trench;
   a gate electrode on the dielectric layer; and
   an aluminum nitride (AlN) layer on the spacer layer and in the trench between the dielectric layer and the spacer layer.

2. The transistor of claim 1, wherein the dielectric layer has a thickness of from about 60 Å to about 600 Å.

3. The transistor of claim 1, wherein the AlN layer has a thickness of from about 1.0 Å to about 10.0 Å.

4. The transistor of claim 1, wherein the AlN layer comprises an Aluminum Gallium Nitride (AlGaN) layer.

5. The transistor of claim 1, further comprising a thin gallium nitride (GaN) layer having a thickness of from about 2.0 to about 50.0 Å between the AlN layer and the trench.

6. The transistor of claim 1, further comprising a gallium nitride (GaN) layer on the AlN layer, the GaN layer being between the dielectric layer and the AlN layer.

7. The transistor of claim 6, wherein the GaN layer has a thickness of from about 2.0 Å to about 30 Å.

8. The transistor of claim 6, further comprising a thin gallium nitride (GaN) layer having a thickness of from about 2.0 to about 50.0 Å between the AlN layer and the trench.

9. The transistor of claim 1, wherein the non-conducting spacer comprises silicon nitride and has a thickness of from about 300 Å to about 3000 Å.

10. The transistor of claim 1, wherein the transistor comprises a normally-off High Electron Mobility Transistor (HEMT).

11. A transistor, comprising:
    a Group III-nitride barrier layer;
    a non-conducting spacer layer on the Group III-nitride barrier layer;
    a gate electrode on the spacer layer;
    a gate implant region in a portion of the barrier layer beneath the gate electrode, wherein the gate electrode is in the trench on the gate implant region and on the spacer layer; and
    dielectric sidewall spacers that extend only on sidewalls of the non-conducting spacer layer in the trench.

12. The transistor of claim 11, wherein the spacer layer includes a trench extending through the spacer layer and exposing a portion of the barrier layer, the transistor further comprising a conformal dielectric layer on the spacer layer and the barrier layer and in the trench.

13. The transistor of claim 11, wherein the implant region has an implant dose of from about $5.0 \times 10^{12}$ cm$^{-2}$ to about $1.0 \times 10^{14}$ cm$^{-2}$.

14. The transistor of claim 11, wherein the dielectric sidewall spacers have a thickness of from about 1.0 nm to about 50.0 nm.

15. The transistor of claim 11, further comprising:
a second non-conducting spacer layer on the gate electrode and the spacer layer; and
a field plate on the second non-conducting spacer.

16. The transistor of claim 15, wherein the field plate is electrically coupled to a source electrode or the gate electrode.

17. The transistor of claim 15, wherein the second non-conducting spacer has a thickness of from about 500 Å to about 5000 Å.

18. The transistor of claim 11, wherein the trench extends into the barrier layer.

19. The transistor of claim 18, wherein the trench extends from about 0 Å to about 200 Å into the barrier layer.

20. The transistor of claim 11, wherein the transistor comprises a normally-off High Electron Mobility Transistor (HEMT).

21. A normally-off Group III nitride transistor exhibiting substantially no mobile charge in a channel under a gate electrode at zero bias during operation of the transistor, the transistor comprising:
a Group III-nitride barrier layer;
a non-conducting spacer layer on the Group III-nitride barrier layer; and
a gate implant region in a portion of the barrier layer, the gate implant region being configured to bend a conduction band under the gate electrode such that no mobile charge is exhibited in the channel under the gate electrode at zero bias.

22. The transistor of claim 21:
wherein the spacer layer defines a trench extending through the spacer layer and exposing a portion of the barrier layer; and
wherein the gate electrode is in the trench on the gate implant region and on the spacer layer.

23. The transistor of claim 21, wherein the implant region has an implant dose of from about $5.0 \times 10^{12}$ cm$^{-2}$ to about $1.0 \times 10^{14}$ cm$^{-2}$.

24. The transistor of claim 21, wherein the non-conducting spacer has a thickness of from about 500 Å to about 5000 Å.

25. The transistor of claim 21, wherein the transistor comprises a normally-off High Electron Mobility Transistor (HEMT).

* * * * *